United States Patent [19]

Maeda et al.

[11] Patent Number: 5,679,165
[45] Date of Patent: Oct. 21, 1997

[54] APPARATUS FOR MANUFACTURING SEMICONDUCTOR DEVICE

[75] Inventors: Kazuo Maeda; Kouichi Ohira; Hiroshi Chino, all of Tokyo, Japan

[73] Assignees: Semiconductor Process Laboratory Co., Ltd.; Canon Sales Co., Inc.; Alcan-Tech Co., Inc., all of, Japan

[21] Appl. No.: 531,908

[22] Filed: Sep. 18, 1995

Related U.S. Application Data

[63] Continuation of Ser. No. 159,479, Nov. 30, 1993, abandoned.

[30] Foreign Application Priority Data

Nov. 30, 1992 [JP] Japan .................. 4-320503

[51] Int. Cl.$^6$ .................. C23C 16/00; C23F 1/02
[52] U.S. Cl. .................. 118/719; 118/724; 118/725; 118/728; 118/729; 118/730; 156/345
[58] Field of Search .................. 118/719, 724, 118/725, 728, 729, 730, 715; 156/345

[56] References Cited

U.S. PATENT DOCUMENTS

| | | | |
|---|---|---|---|
| 3,233,578 | 2/1966 | Capita | 118/49.1 |
| 3,456,616 | 7/1969 | Gleim et al. | 118/49.5 |
| 3,853,091 | 12/1974 | Christensen et al. | |
| 4,009,680 | 3/1977 | Fengler | 118/49.1 |
| 4,599,069 | 7/1986 | Murakami et al. | 118/725 |
| 4,625,678 | 12/1986 | Shioya et al. | 118/724 |
| 4,715,921 | 12/1987 | Maher et al. | 156/345 |
| 4,769,790 | 9/1988 | Yamashita | 365/189 |
| 4,851,256 | 7/1989 | Matsuyama et al. | 427/39 |
| 4,886,592 | 12/1989 | Anderle et al. | 204/298 |
| 4,951,603 | 8/1990 | Yoshino et al. | 118/719 |
| 5,013,385 | 5/1991 | Maher et al. | 156/345 |
| 5,091,217 | 2/1992 | Hey et al. | 118/719 |
| 5,230,741 | 7/1993 | Van De Ven et al. | 118/728 |
| 5,269,847 | 12/1993 | Anderson | 118/715 |
| 5,302,209 | 4/1994 | Maeda et al. | 118/719 |
| 5,332,442 | 7/1994 | Kubodera et al. | 118/725 |

FOREIGN PATENT DOCUMENTS

| | | |
|---|---|---|
| 0095887 | 5/1983 | European Pat. Off. . |
| 0319121 | 6/1989 | European Pat. Off. . |
| 0399616 | 11/1990 | European Pat. Off. . |
| 0467624 | 1/1992 | European Pat. Off. . |
| 0532758 | 3/1993 | European Pat. Off. . |
| 61-136234 | 6/1986 | Japan . |
| 116768 | 5/1987 | Japan . |
| 6140340 | 5/1994 | Japan . |

*Primary Examiner*—R. Bruce Breneman
*Assistant Examiner*—Rodney G. McDonald
*Attorney, Agent, or Firm*—Lorusso & Loud

[57] ABSTRACT

An apparatus, for forming a film according to an automated continuous CVD (Chemical Vapor Deposition) method includes a wafer holder having a plurality of separate, detachable susceptors, a rotary shaft for rotating the wafer holder to rotate wafer mounting surfaces of the susceptors in one plane, a gas distributor spaced from the wafer holder and facing the moving surface of the wafer mounting surface to discharge a reaction gas onto the wafer mounting surfaces, and a heating instrument spaced from the wafer holder and facing the moving surface of the opposite side of the wafer mounting surfaces, in order to keep the wafer at a stable temperature during forming a film and to allow maintenance and repair to be easily and efficiently performed.

8 Claims, 12 Drawing Sheets

APPARATUS FOR MANUFACTURING SEMICONDUCTOR DEVICE

This application is a continuation of application Ser. No. 08/159,479, filed 30 Nov. 1993, now abandoned.

BACKGROUND OF THE INVENTION

1. Field of the Invention

The present invention relates to an apparatus for forming a film, particularly to an automated and continuous apparatus for forming a film through CVD (Chemical Vapor Deposition).

2. Field of the Related Art

The CVD apparatus for mass production includes the following types.

(1) Batch process CVD apparatus
(2) Continuous CVD apparatus
  (a) Conveyer type
  (b) Walking beam type
(3) Multi-chamber CVD apparatus Though the above batch process CVD apparatus for forming a film on many wafers at the same time has a high mass productivity, it cannot adjust for an increase of wafer diameter or it is not suitable for accurate production control. Moreover, the throughput is not always high because the treatment speed is low.

Figure 1A:
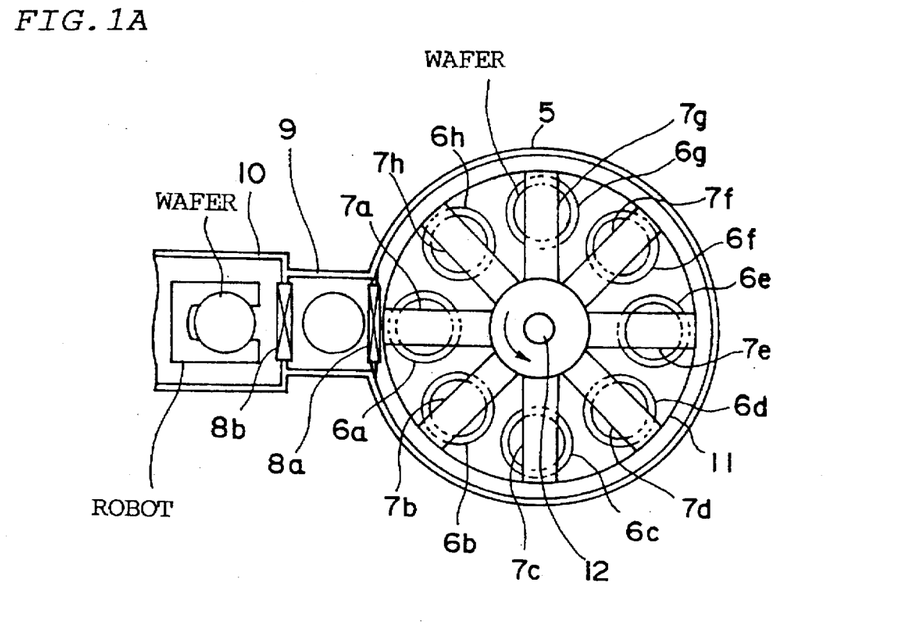
FIG. 1A is a side view of a conveyer-type continuous CVD apparatus for continuously forming films in succession according to the related art.
Figure 1B:
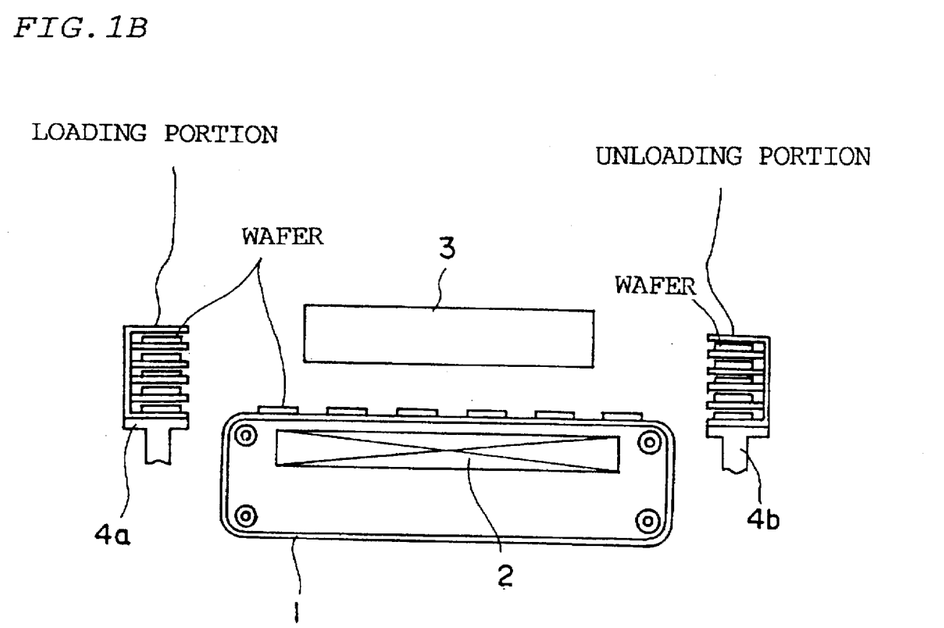
FIG. 1B is a top view of a walking-beam-type continuous CVD apparatus according to the related art.
Figure 1C:
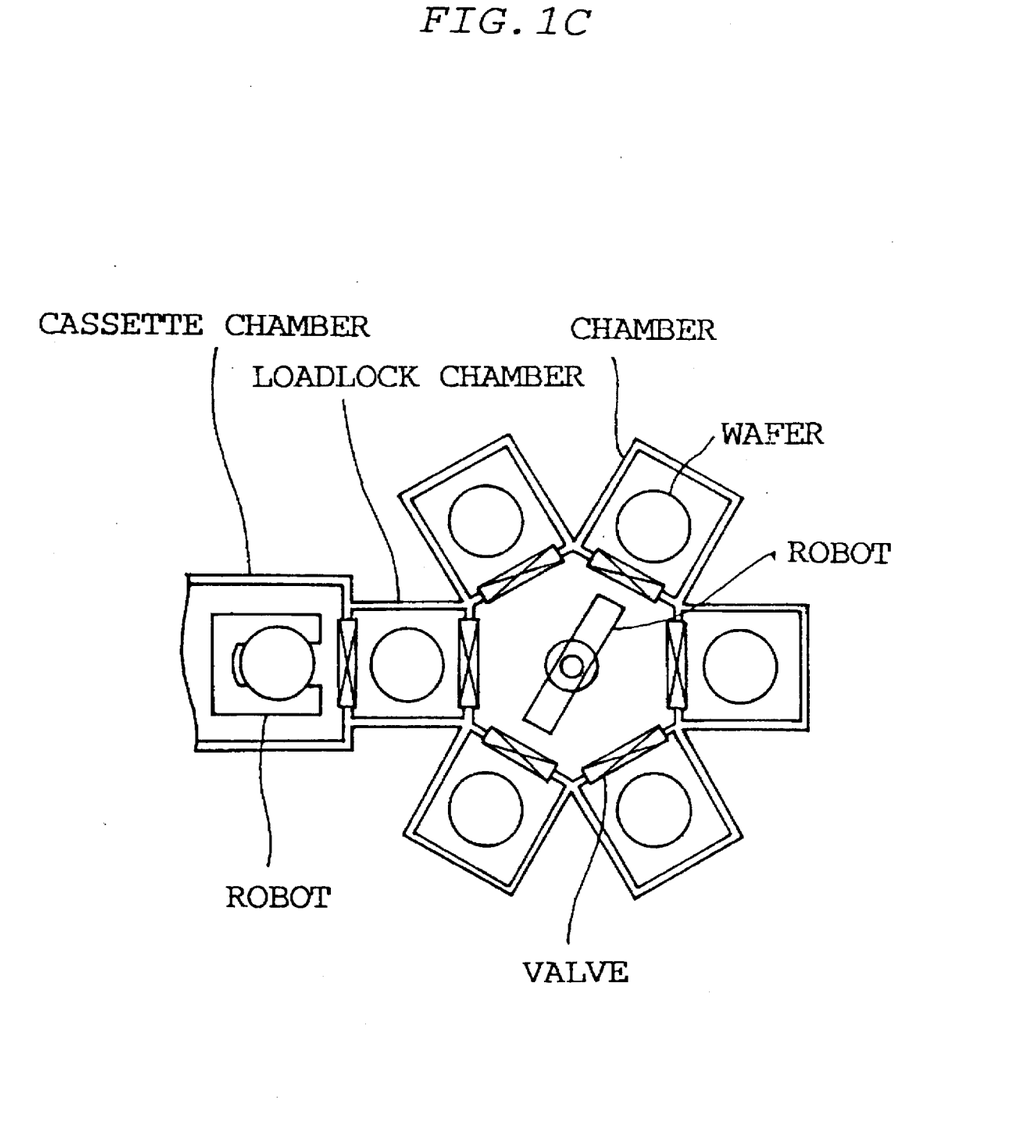
FIG. 1C is a side view of a multi-chamber CVD apparatus according to the related art.

The multi-chamber CVD apparatus, as shown in FIG. 1C, is used for forming a film at a low pressure. It is capable of various types of treatments and is highly flexible because each chamber is independent. However, the throughput is very low.

Therefore, to allow for an increase in wafer diameter or to realize a high throughput, the continuous CVD apparatus for forming a film on a Plurality of wafers in sequence is advantageous.

FIG. 1B shows a conveyer-type continuous CVD apparatus which is mainly used to form a film at normal pressure. A heater 2 is secured under a conveyer belt 1 separate from the belt 1. A gas distributor 3 is provided above the conveyer belt 1. 4a is a cassette station for wafer loading, and 4b is a cassette station for wafer unloading. Wafers are mounted on the conveyer belt 1 for movement in order, and indirectly radiant-heated by heater 2 provided under the conveyer belt 1.

FIG. 1A shows a walking-beam-type continuous CVD apparatus which is mainly used to form a film by plasma CVD at low pressure. Symbol 5 is a chamber and symbols 6a to 6h are susceptors having respective heaters which are secured to a base 11. Symbols 7a to 7h are eight walking beams mounted for rotation around a rotary shaft 12 and 8a and 8b are gate valves. A load-lock chamber 9 is connected to the chamber 5 through the gate valve 8a and a cassette chamber 10 is connected to the load-lock chamber 9 through the gate valve 8b.

A film is formed by using the apparatus as follows. First, a wafer is moved from the load-lock chamber 9 onto the susceptor 6a in the chamber 5 and thereafter it is heated up to a predetermined temperature by a heater under the susceptor 6a.

Then, a film is formed on the wafer on the susceptor 6a and thereafter the wafer is moved to the susceptor 6b by the walking beam 7a to form the next film. At the same time, the next wafer is moved from the lock chamber 9 onto the susceptor 6a in the chamber 5 and heated up to a predetermined temperature by a heater under the susceptor 6a. According to the above procedure, a film is formed on the wafer on the susceptors 6a and 6b.

Thus, wafers are introduced into the chamber 5 one by one to continuously form films on the wafers while moving them among the susceptors 6a to 6h in order. Therefore, by passing a wafer along the susceptors 6a to 6h once, it is possible to form different types of multilayer films or single-layer films with a predetermined thickness on the wafer.

(1) However, the conveyer-type CVD apparatus has problems in that it is difficult to accurately measure the wafer temperature because the wafers move relative to the secured heater 2 and it is impossible to accurately control the wafer temperature because the heater 2 is to some extent spaced from the conveyer belt 1.

(2) Also for the walking-beam-type CVD apparatus, it cannot be avoided that the wafer temperature lowers because the wafers are spaced from the heater under the susceptors 6a to 6h. Therefore, the CVD apparatus has a problem in that strain is left in the formed film because of the temperature cycle during film forming. Moreover, the apparatus has another problem in that a lot of time is required to stabilize the wafer temperature and temperature adjustment is complex because it is necessary to reheat a wafer to keep the wafer temperature at a predetermined value when moving the wafer from the susceptor 6a to the next susceptor 6b.

To solve these problems, it has been proposed to secure a wafer holder to a heater and move a gas distributor. However, the problem with such procedures is that wafers cannot be continuously treated because they do not move. Moreover, there is the problem that operations cannot be efficiently performed because both a wafer holder and heater must be replaced or removed for maintenance or checkout even when it is sufficient to replace or remove only one of them.

SUMMARY OF THE INVENTION

An object of the present invention is to provide an apparatus for forming a film, which makes it possible to continuously form films by moving a wafer while keeping the temperature of a wafer at a predetermined value, to accurately control a production of each wafer, and to easily and efficiently perform maintenance and checkout.

In the apparatus for forming a film of the present invention, a wafer holder, gas distributor, and heating instrument are all separate and the wafer holder is secured to a rotary shaft so that it rotates to provide a moving surface between the gas distributor and heating instrument.

Therefore, because a wafer held by the wafer holder can be moved in a circle, it is possible to continuously form films and keep a high throughput.

Moreover, because the wafer holder is separated from the heating instrument, it is possible to directly contact electrical wiring to the secured heating instrument. Therefore, the structure of the apparatus is simplified and the maintenance is easy.

Furthermore, because a wafer is held by a wafer holder with a large heat capacity, it is possible to prevent the temperature of the wafer from lowering while the wafer moves and the wafer temperature thereby remains stable. Therefore, it is possible to form a film with a uniform thickness and high quality on the wafer.

Furthermore, by separately providing a plurality of susceptors as a wafer-holder and a plurality of gas dischargers, it is possible to accurately control the production of each wafer and quickly form different types of multilayer films.

Furthermore, because a wafer holder has a plurality of separate susceptors and each suscepter is detachable, it is possible to easily and efficiently perform maintenance and checkout.

Furthermore, because each heater is secured by a rotary shaft with provision for moving the heater toward or away from the wafer holder, it is possible to efficiently heat a wafer by bringing the heater into close proximity at the time of forming a film and to easily set or detach a susceptor by withdrawing the heater from the proximity of the wafer holder.

Furthermore, because each susceptor for holding a wafer by suction has a suction port and can be connected to or disconnected from a movable exhaust pipe, it is possible to connect the exhaust system to a susceptor in forming a film and disconnect it from the susceptor at the time of repair or the like. Thereby, it is possible to more easily and efficiently maintain or check the apparatus.

Furthermore, because a movable temperature measuring means can be set in or removed from a recess in the susceptor, it is possible to set the temperature measuring means in the susceptor in forming a film and remove it from the susceptor in the case of repair or the like. Thereby, it is possible to more easily and efficiently perform maintenance or checkout.

Furthermore, because both an exhaust pipe and a temperature measuring means are held together by a holding means movable along a plane, it is possible to simultaneously set or detach the exhaust pipe and the temperature measuring means by movement of the holding means.

Furthermore, because the susceptor comprises a frame and a metallic wafer mounting table and at least a portion of the frame contacting the wafer mounting table is made of a heat insulating material, it is possible to prevent heat from escaping to the frame from the heated wafer mounting table. Thereby, the wafer temperature in forming a film is stabilized.

DESCRIPTION OF THE PREFERRED EMBODIMENT (1) Description of the CVD Apparatus of the First Embodiment of the Present Invention (A) Description of Overall Construction of the CVD Apparatus of the First Embodiment of the Present Invention.

Figure 7:
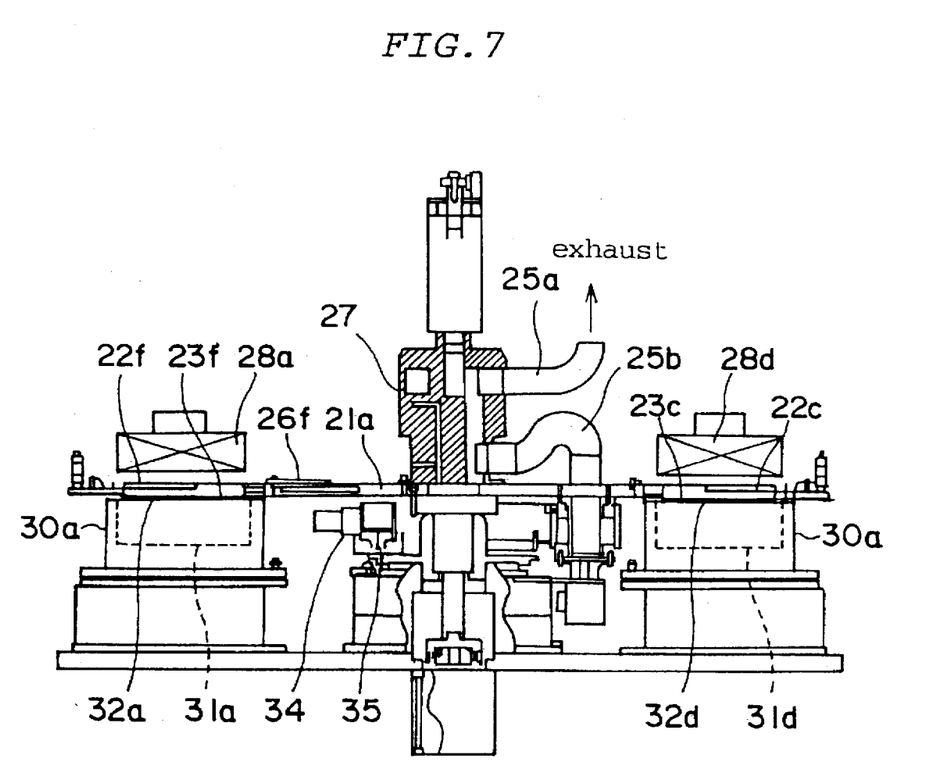
FIG. 7 is an elevational side view showing the overall construction of the CVD apparatus of an embodiment of the present invention.
Figure 8:
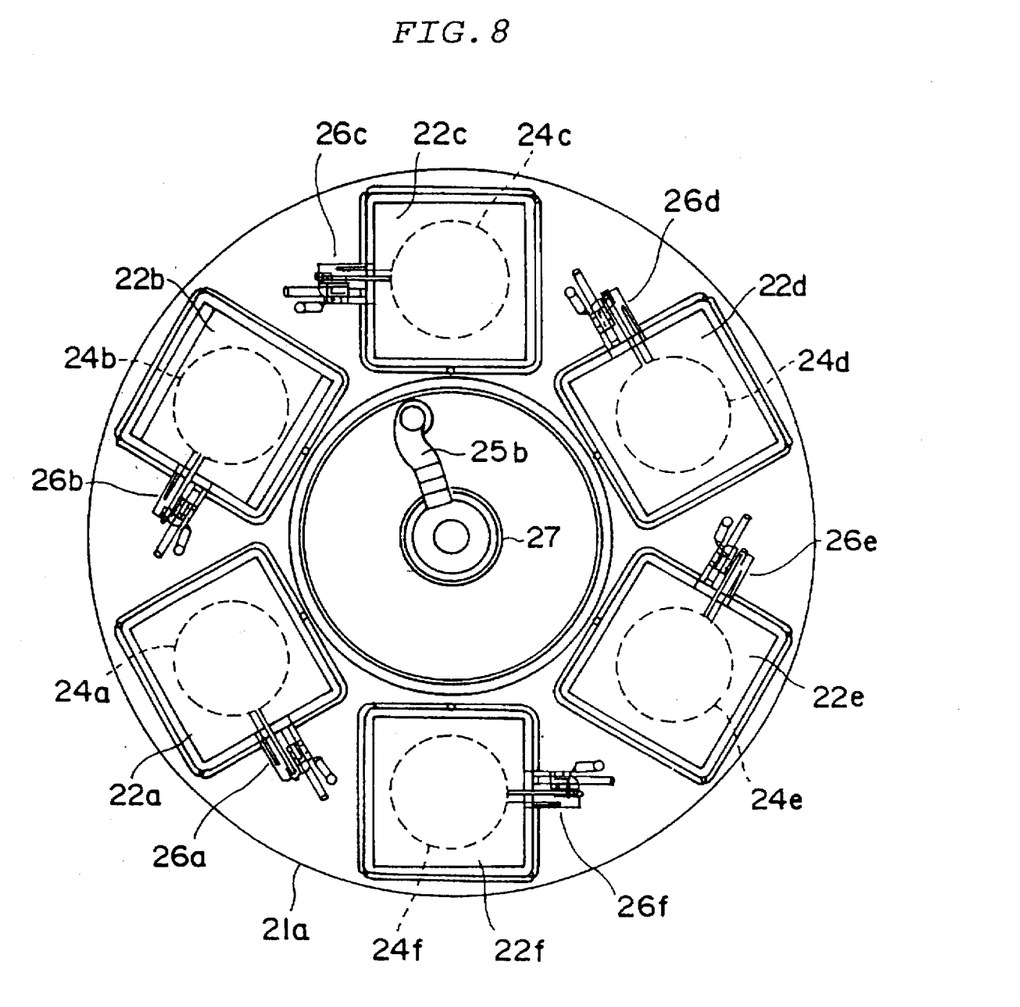
FIG. 8 is a top view showing the structural details of a wafer holder of the CVD apparatus of an embodiment of the present invention.
Figure 10:
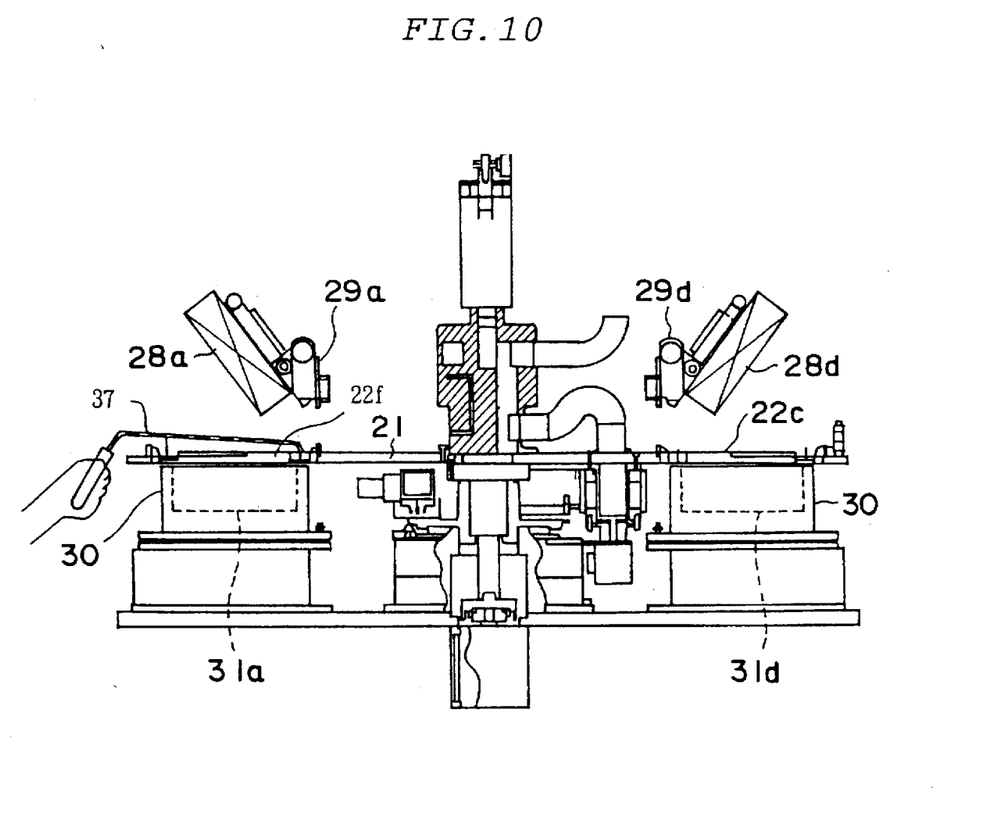
FIG. 10 is an elevational view showing the heater of the CVD apparatus of an embodiment of the present invention pivoted upward to allow a susceptor to be attached or detached.

In FIG. 7, FIG. 8, and FIG. 10, symbol 21 is a discoid wafer holder on which six detachable susceptors $22a$ to $22f$ are set. Wafer mounting surfaces $23a$ to $23f$ of the susceptors $22a$ to $22f$ face downward, whereby wafers $24a$ to $24f$ mounted on the wafer mounting surfaces $23a$ to $23f$ face gas dischargers $32a$ to $32e$ of a gas distributor 30. A pipe $25b$ is connected to the wafer holder 21, whereby a gas is exhausted or introduced through the pipe $25b$ and a exhaust port/gas introduction port $25a$. Moreover, the susceptors $22a$ to $22f$ are provided respectively with an oscillation unit (not illustrated) that allows each of the susceptors to rotate around an axis vertical to the wafer mounting surfaces $23a$ to $23f$ and to move with linear motion in the radial direction.

Symbols $26a$ to $26f$ are holding means for holding an exhaust pipe and a thermocouple (a temperature measuring means) pair set on each of the susceptors $22a$ to $22f$. The exhaust pipes are connected to the pipe $25b$ to secure the wafers $24a$ to $24f$ to the wafer mounting surfaces $23a$ to $23f$ by suction and to detach the secured wafers by nitrogen gas pressure.

Symbol 27 is a rotary shaft to which the wafer holder 21 is secured. The wafer holder 21 rotates around the rotary shaft 27 to provide a moving surface in a plane between gas dischargers $31a$ to $31e$ and six heaters, of which $28a$ and $28d$ are shown, while holding the wafers $24a$ to $24f$.

Symbols $28a$ and $28d$ are two of the heaters (heating instruments) respectively facing the susceptors $22a$ to $22f$ on the wafer holder 21. The heaters are separated from each other so as to independently heat the susceptors $22a$ to $22f$ from the opposite side of the wafer mounting surfaces $23a$ to $23f$ by means of heat radiation and heat conduction. Thereby, the temperature of the susceptors $22a$ to $22f$ rises and the wafers $24a$ to $24f$ are indirectly heated.

Each of the heaters is secured to a rotary shaft parallel to the mounting surfaces of the susceptors $22a$ to $22f$. Each of the heaters pivots about its rotary shaft downward or upward to approach the wafer holder 21, or to go away from the wafer holder 21 to make room above the wafer holder 21 to set or detach the susceptors $22a$ to $22f$. However, FIG. 10 shows only two of the six rotary shafts, $29a$ and $29f$.

Figure 9:
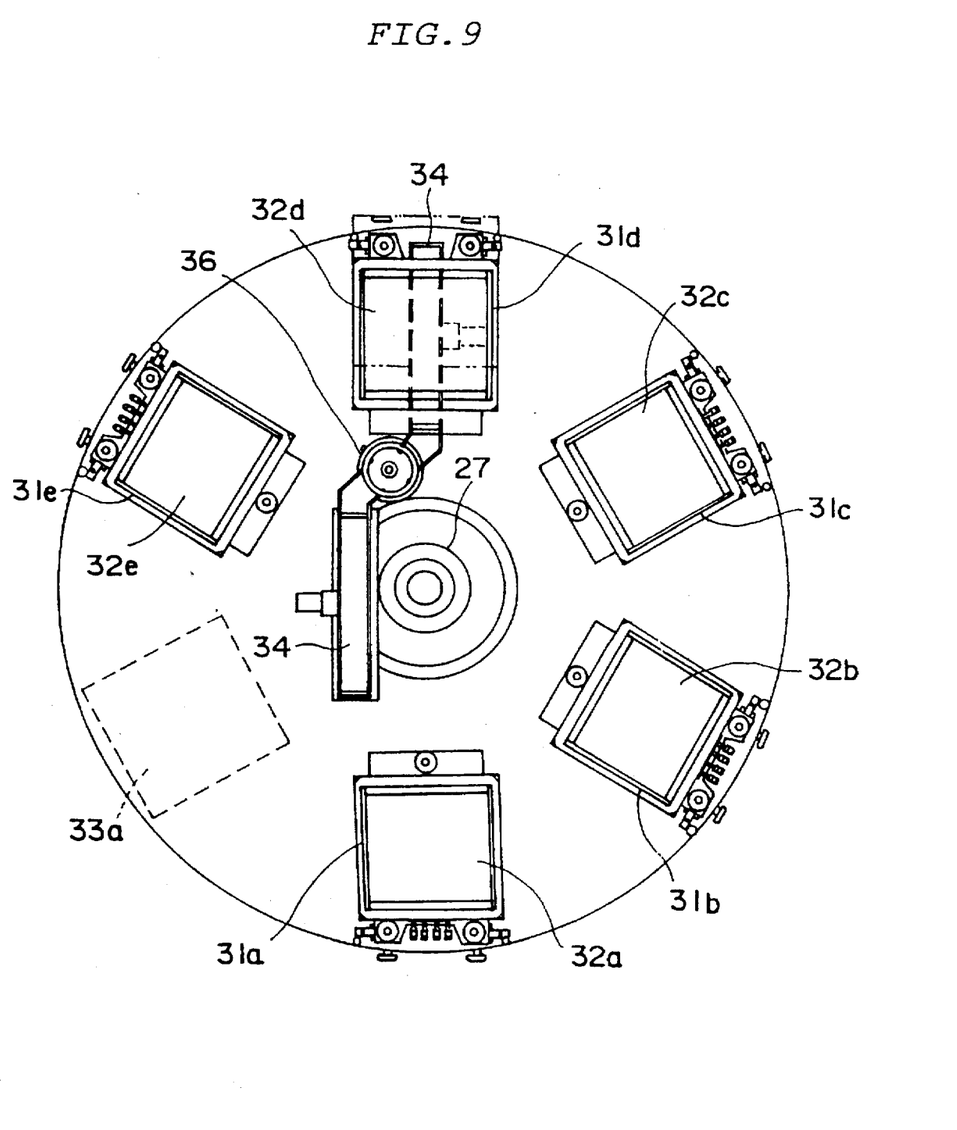
FIG. 9 is a top view showing the structural details of a gas distributor of the CVD apparatus of an embodiment of the present invention.

In FIGS. 7 and 9, symbol 30 is a gas distributing instrument for supplying reaction gas to wafers and includes independent gas dischargers $31a$ to $31e$ set at five positions at intervals corresponding to the intervals between the susceptors $22a$ to $22f$ arranged in a circle around the rotary shaft 27. However, there is one susceptor position in which no gas discharger is set. That is, the position of the loading/ unloading station 33a. Used or excess reaction gas is exhausted through an exhaust port close to the gas dischargers 31a to 31e. The gas discharge surfaces 32a to 32e of the gas dischargers 31a to 31e are turned upward to face the wafer mounting surfaces 23a to 23f of the susceptors 22a to 22f.

A cleaner 34 removes reaction products sticking to the gas discharge surfaces 32a to 32e. The cleaner 34 is secured to a rotary shaft 36 for movement together with the wafer holder 21, and is held in the vicinity of the rotary shaft 27 of the wafer holder 21 when it is not in use and moved onto the gas discharge surfaces 32a to 32e when it is used. When cleaning the gas discharge surfaces 32a to 32e, the cleaner 34 rubs the gas discharge surfaces 32a to 32e with a brush 35 to remove dust from the surfaces and immediately evacuates the removed dust so that it does not scatter.

For the CVD apparatus of the above embodiment of the present invention, the wafer holder 21 is secured to the rotary shaft 27 and rotates around the rotary shaft 27 to provide a moving surface between the gas dischargers and heaters while holding the wafers 24a to 24f.

Because, the wafers 24a to 24f are moved in a circle around the rotary shaft 27, it is possible to continuously form films and keep a high throughput.

Moreover, because the wafer holder 21 is separate from the heaters, it is possible to connect electrical wiring to the secured heaters. Therefore, the structure of the CVD apparatus is simplified and the maintenance is easy.

On the contrary, if the wafer holder 21 was to be combined with the heaters the structure would become complicated including a complicated electrical wiring connection to the rotating heaters. Therefore, the structure of the first embodiment of the present invention is more advantageous.

Furthermore, because the susceptors 22a to 22f and gas dischargers 31a to 31e are separate from each other, it is possible to precisely control the production of each wafer and form different types of multilayer films.

Furthermore, because the wafer holder 21 has the detachable susceptors 22a to 22f separate from each other, it is possible to easily and efficiently perform maintenance and checkout.

Furthermore, because the apparatus has shafts which allow the heaters to pivot toward or away from the wafer holder 21, it is possible to efficiently heat the wafers 28a to 28f by positioning the heaters proximate to the wafer holder 21 and easily set or detach the susceptors 22a to 22f by pivoting them away from the holder to make room above the susceptors 22a to 22f.

In this embodiment, the gas distributor 30 is positioned under the wafer holder 21 and the heaters are positioned above the wafer holder 21. However, it is also possible to position the gas distributor 30 above the wafer holder 21 and the heaters under the holder.

(B) Detailed Description of the Structure of the Susceptor and of a Holder for an Exhaust Pipe and a Thermocouple.

The structure of a susceptor and that of a holder for an exhaust pipe and a thermocouple are described below in detail by referring to FIGS. 2A and FIGS. 2B, FIGS. 3A to FIGS. 3D, FIGS. 4A to FIGS. 4C, FIGS. 5A and FIGS. 5B, and FIGS. 6A to FIGS. 6C.

Figures 4A, 4B, 4C:
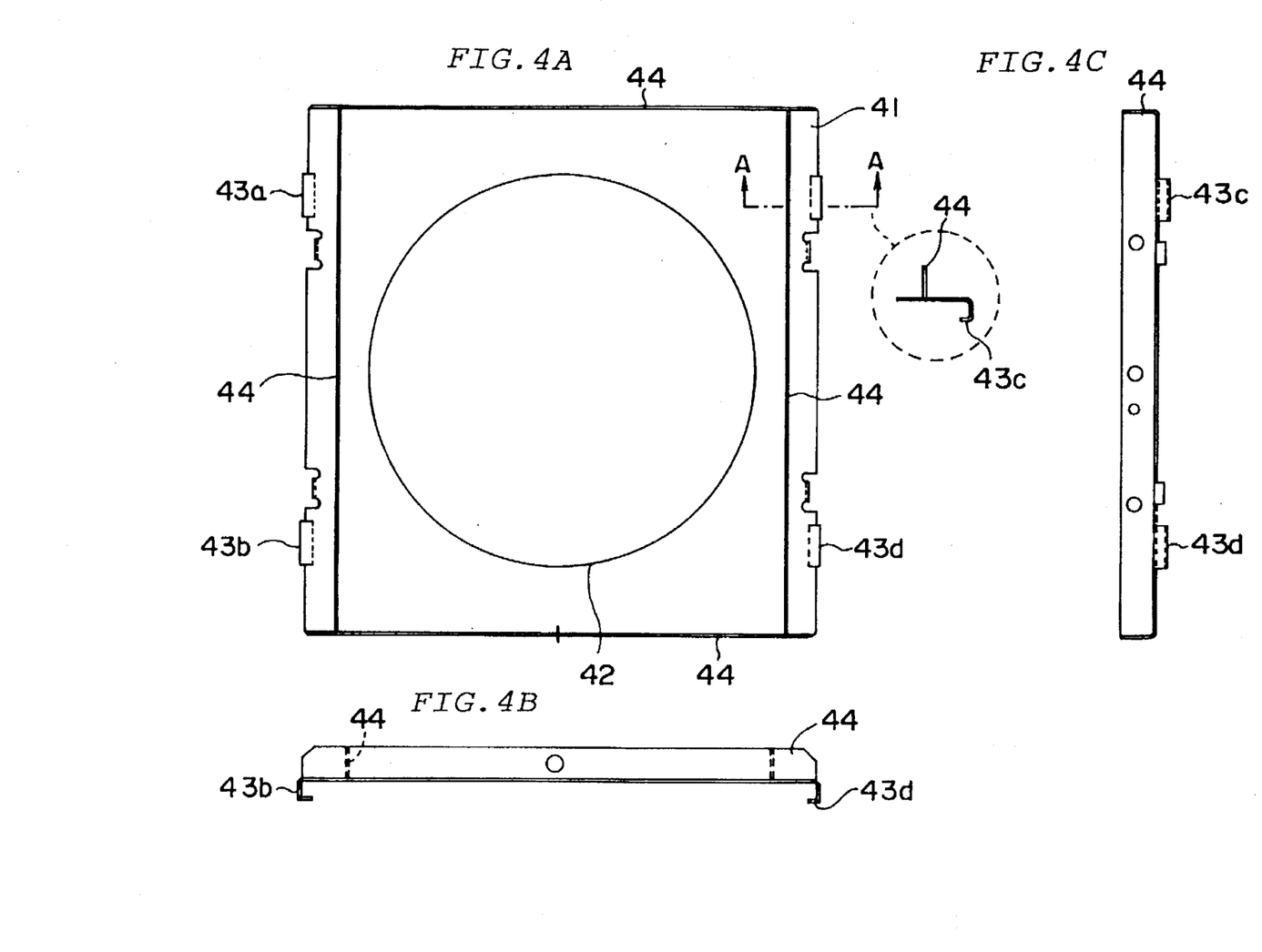
FIGS. 4A to FIGS. 4C are a top view and a side views, respectively, showing the structural details of a frame for supporting the wafer mounting table of the susceptor of an embodiment of the present invention.

In these figures, symbol 41 is a frame made of a square aluminum board with a circular opening 42 formed at the center. Hooks 43a to 43d are formed on the margin of the frame 41, one each at four points, to which a flat holding frame 45 is hooked. A columnar wafer mounting table 47 is put into the opening 42 of the frame 41 and the opening 46 of the holding frame 45. Moreover, a screen-shaped heat shield 44 for preventing heat loss from the heated wafer mounting table 47 is provided around the margin of the opening 42 on a face opposite the face where the hooks 43a to 43d are formed.

Figure 5A:
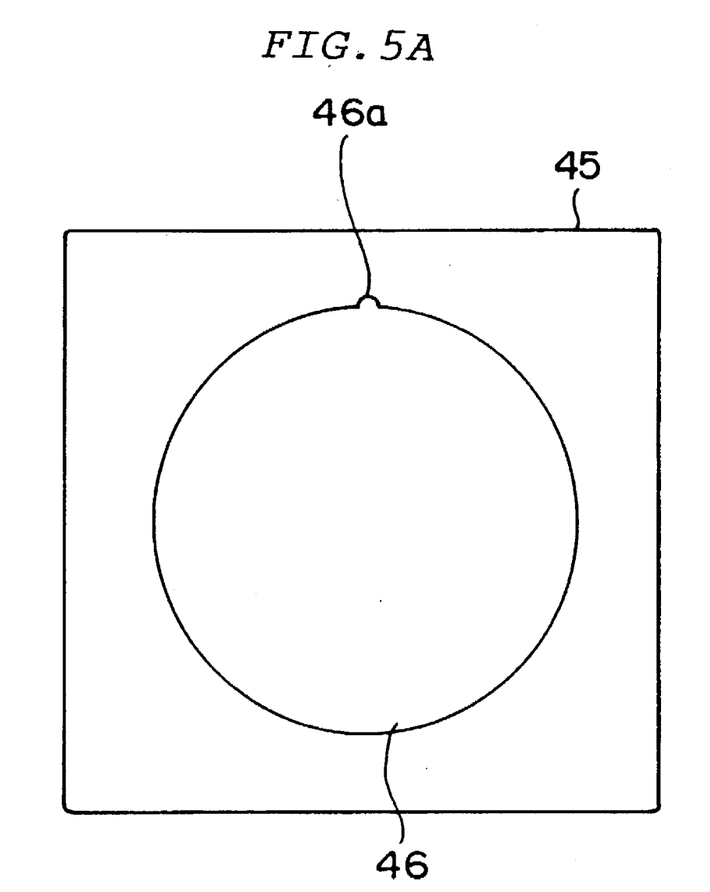
FIGS. 5A and FIGS. 5B are a top view and a side view, respectively, showing the structural details of a frame of a heat insulating material for supporting the wafer mounting table of the susceptor of an embodiment of the present invention.
Figure 5B:
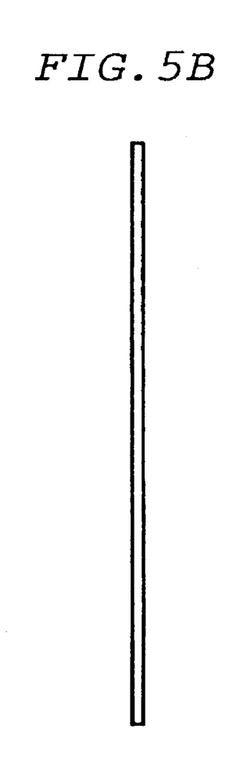

The flat holding frame 45 is hooked to the hooks 43a to 43d of the frame 41. The opening 46 which receives the wafer mounting table 47 is formed in the holding frame 45 and moreover a recess 6a for aligning is provided at the margin of the opening 46 so that the wafer mounting table 47 may be set at a predetermined position. To prevent the conduction of heat from the heated wafer mounting table 47, the holding frame 45 is made of quartz to provide an adiabatic effect.

Figure 6A:
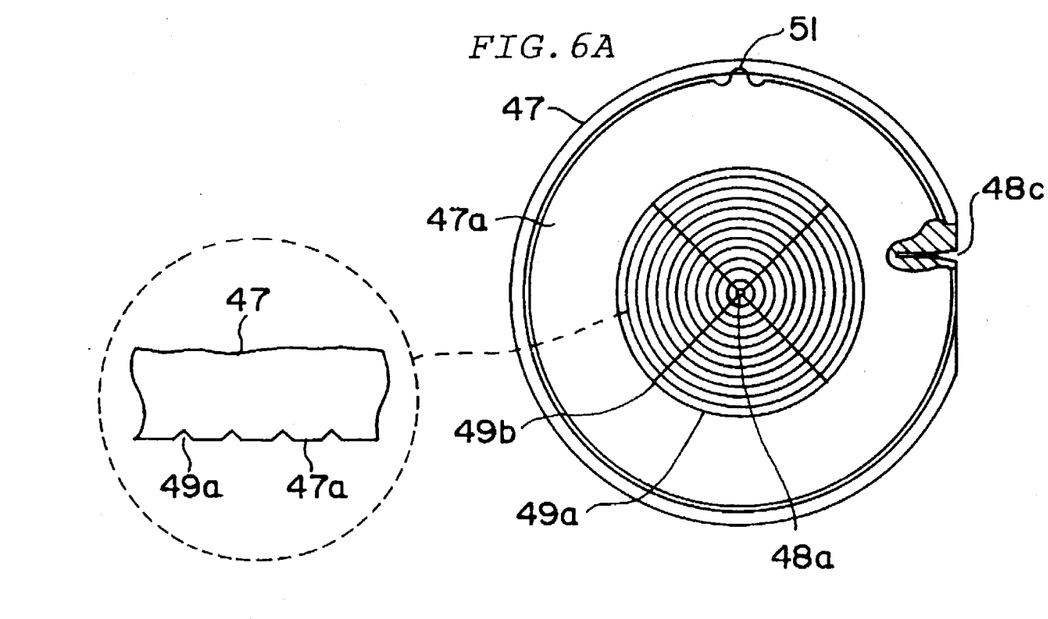
FIGS. 6A to FIGS. 6C are a top view and a side view, respectively, showing the structural details of a wafer mounting table of the susceptor of an embodiment of the present invention.
Figure 6B:
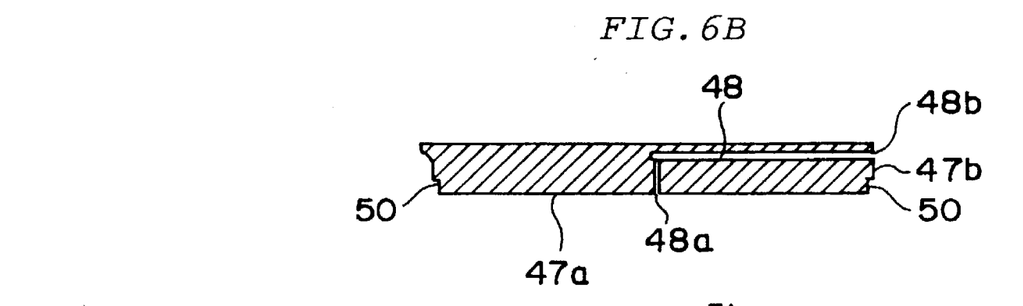
Figure 6C:
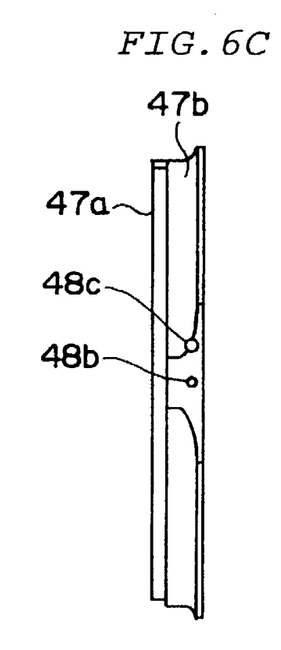

Wafer mounting table 47 is made of stainless steel, which has a large heat capacity so that the heating temperature does not easily lower. Suction ports 48a and 48b are formed in wafer mounting surface 47a and side face 47b, respectively. The suction ports 48a and 48b are connected each other by a through-hole 48 in the wafer mounting table 47. A recess 48c which receives a thermocouple (temperature measuring means) is set formed at the side face 47b of the wafer mounting table 47 adjacent the suction port 48b.

Concentric grooves 49a around the suction port 48a and radial grooves 49b crossing the concentric grooves 49a and communicating with the suction port 48a are formed on the wafer mounting surface 47a. When a wafer is mounted on the wafer mounting table 47 and a vacuum is established, the gas in these grooves 49a and 49b is evacuated and the wafer is thereby secured. This function is called a vacuum chuck.

Moreover, a hooking portion 50 for hooking the holding frame 45 is formed at the side face of the wafer mounting table 47. The wafer mounting table 47 has an aligning protrusion 51 which mates with the aligning recess 46a of the holding frame 45.

Figure 2A:
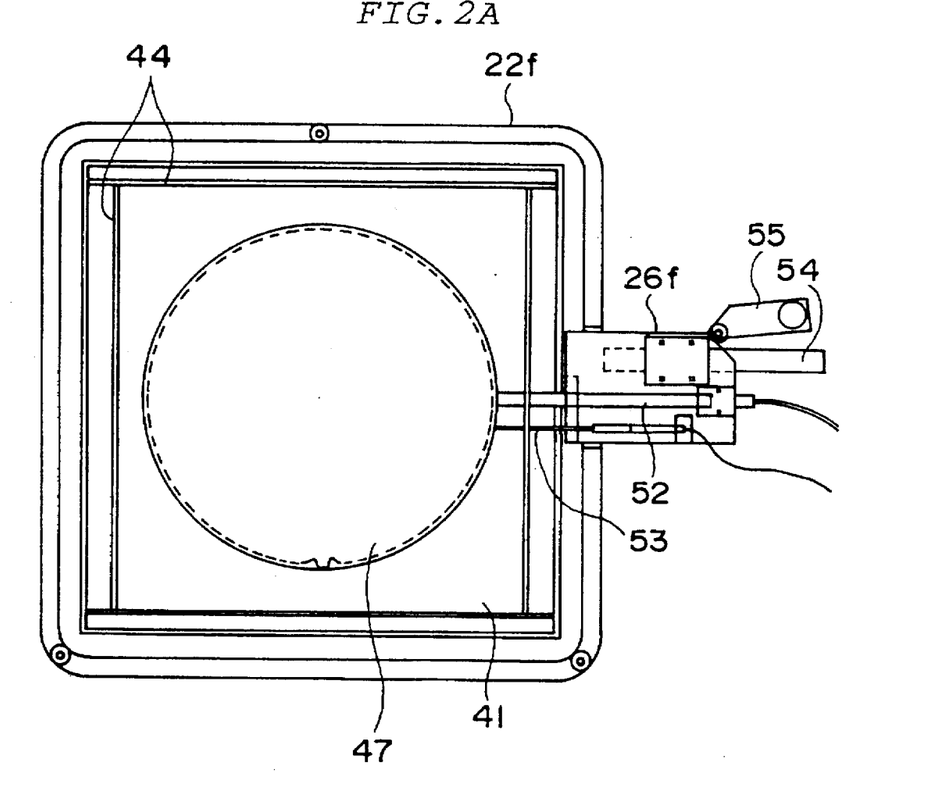
FIGS. 2A and FIGS. 2B are a top view and a side view, respectively, showing the structural details of a susceptor and a holder having both an exhaust pipe and a thermocouple in the CVD apparatus of an embodiment of the present invention.
Figure 2B:
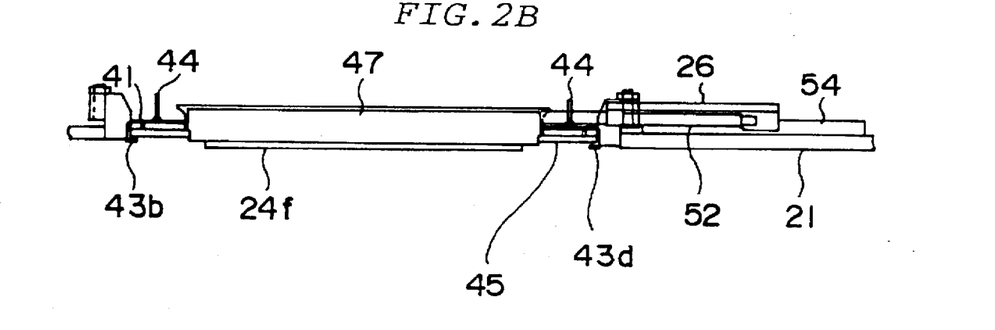

Symbol 26f is a holder, for holding both an exhaust pipe 52 and the thermocouple 53. The holder 26f is biased against the wafer mounting table 47 by a spring. The exhaust pipe 52 and the thermocouple 53 are secured to or detached from the wafer mounting table 47 by moving the holder 26f toward or go away from the side face 25b of the wafer mounting table 47 on a rail 54 provided on the surface of the wafer holder 21. Moreover, a fastener 55 which stops the movement of the holder 26f, biased by the spring, is provided to keep the holder 26f spaced from the wafer mounting table 47.

As described above, a susceptor of the embodiment of the present invention makes it possible to connect or disconnect an exhaust system to or from the suction port 48b at the side face 47b of the wafer mounting table 47 with the exhaust pipe 52 movable on a plane. Therefore, it is possible to engage the exhaust system with the wafer mounting table 47 in forming a film and to detach the system from the table in the case of repair or the like. Thus, the apparatus can be more easily maintained or checked.

Moreover, the thermocouple 53 can be engaged with or detached from the wafer mounting table 47 because it is movable on a plane. Therefore, it is possible to engage the thermocouple 53 with the wafer mounting table 47 in forming a film and detach it from the table for repair or the like. Thereby, the apparatus can be more easily maintained or checked.

Moreover, because both the exhaust pipe 52 and the thermocouple 53 are held by the holding means 26f movable on a plane, the exhaust pipe 52 and thermocouple 53 can be simultaneously engaged or detached by moving the holding means 26f.

(C) Description of Susceptor Setting/Detaching.

A method for setting or detaching the susceptors 22a to 22f to or from the wafer holder 21 is described below by referring to FIGS. 3(a) to 3(d) and FIG. 10.

It is necessary to detach the susceptors 22a to 22f when replacing them with new ones.

To set the susceptor 22f on the wafer holder 21, it is first necessary to pivot the heater 28a away from the wafer holder 21 so that the heater does not interfere with setting of the susceptor 22f. Because the heater 28a can be pivoted downward or upward about a shaft parallel with the surface of the susceptor 22f, the heater 28a may be pivoted upward as shown in FIG. 10 to make room above the susceptor 22f setting surface, thereby, allowing the susceptor 22f to be set in place by hand or with a setting/detaching instrument 37. At that time, the holder 26f is moved away from the side face 47b of the wafer mounting table 47 and the exhaust pipe 52 and thermocouple 53 are thereby disconnected from the wafer mounting table 47.

Figure 3A:
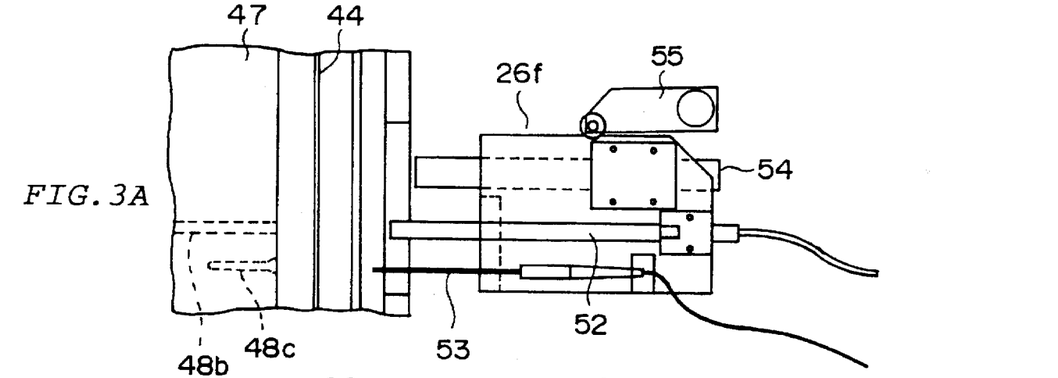
FIGS. 3A and FIGS. 3B are a top view and a side view, respectively, showing the holder disengaged from a susceptor
Figure 3B:
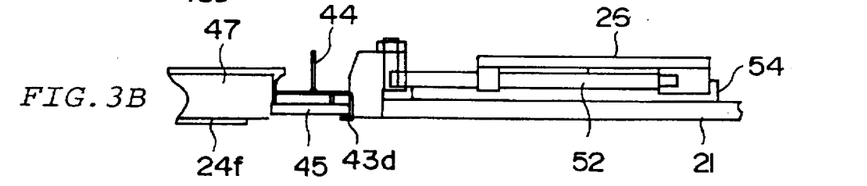
Figure 3C:
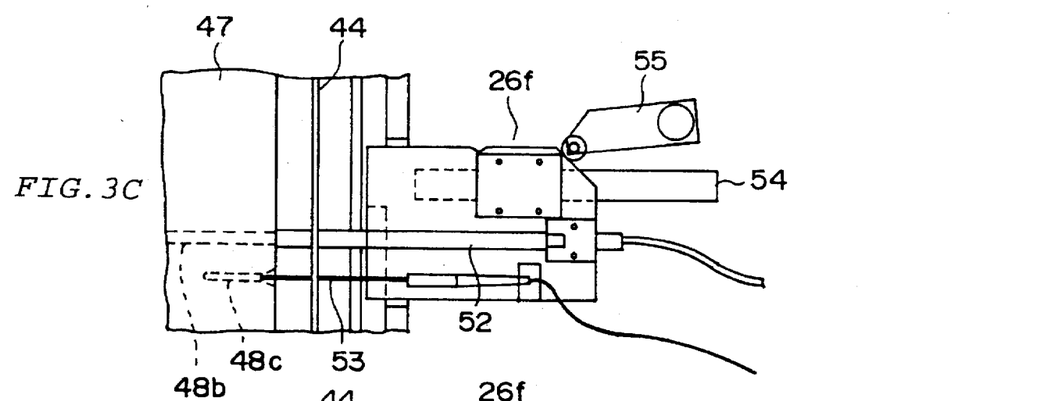
FIGS. 3C and FIGS. 3D are a top view and a side view respectively, showing the state in which the holder is engaged with the susceptor.
Figure 3D:
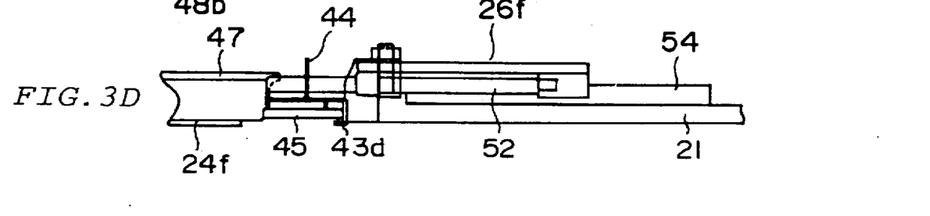

Subsequently, as shown in FIG. 3C and FIG. 3D, the holder 26f is moved toward the side face 47b of the wafer mounting table 47 whereby both the exhaust pipe 52 and thermocouple 53 are set in the suction port 48b and the recess 48c, respectively.

After the susceptor 22f is set in place, the next susceptor 22e is set in place in the same way as the above. Thus, the susceptors 22d to 22a are set in place one by one.

It is also possible to detach the susceptors 22a to 22f by reversing the above procedure.

As described above, the susceptors 22a to 22f can be easily set in place or detached by pivoting the heaters.

Because the heaters pivot, it is possible to reliably position the heaters at predetermined positions above each of the susceptors 22a to 22f. It is thereby possible to minimize temperature variations due to differences in heat radiation and heat conduction among the heaters.

Figure 11A:
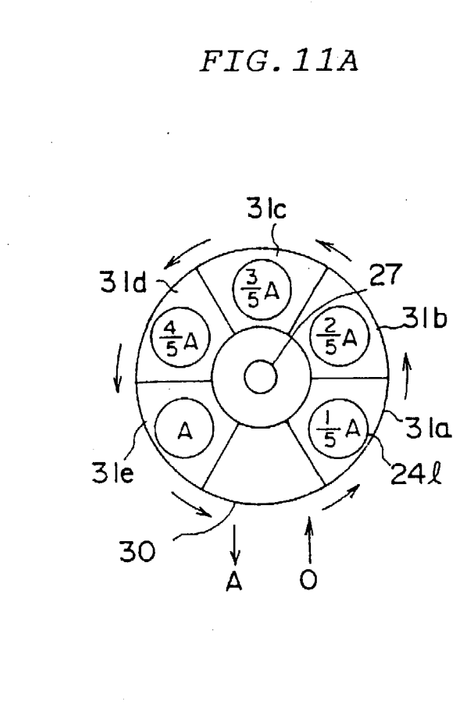
FIGS. 11A to FIGS. 11C are views illustrating a semiconductor device manufacturing process using the CVD apparatus of an embodiment of the present invention.
Figure 11B:
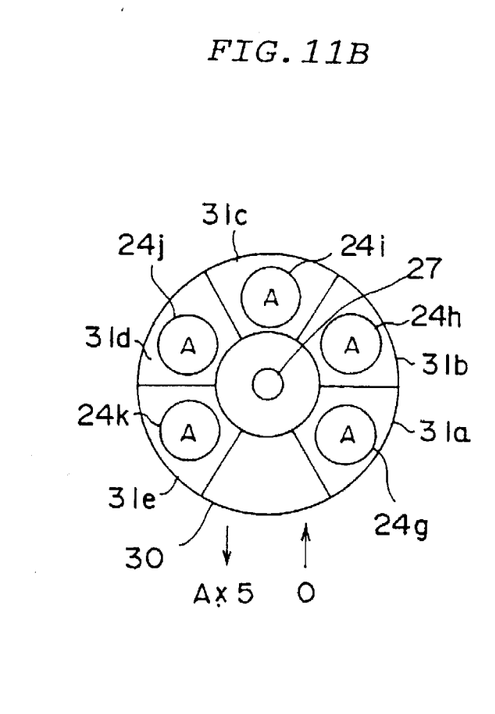
Figure 11C:
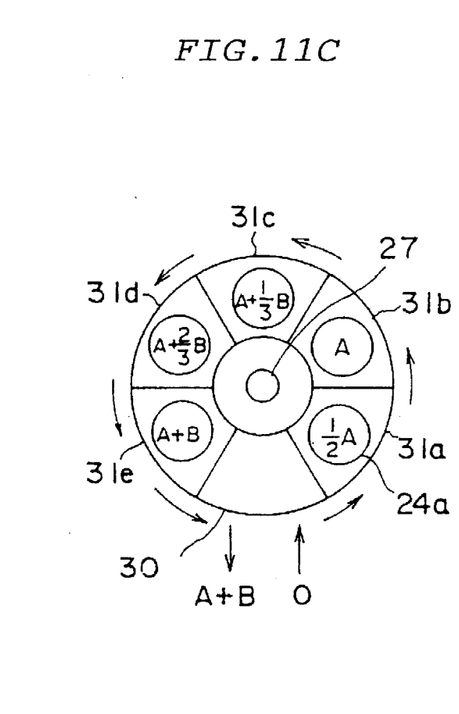

(D) Description of the Method for Forming Film Using the CVD Apparatus of an Embodiment of the Present Invention A method for forming a two-layer insulating film on a wafer by using the CVD apparatus having the gas distributor 30 and wafer holder 21 shown in FIG. 7 is described below with reference to FIGS. 2 to 10 and FIGS. 11C. In this case, as shown in FIGS. 11C, a two-layer film made of a CVD $SiO_2$ film and a PSG film, each having a predetermined thickness, are formed on the wafers 24a to 24f while the wafer holder 21 completes one round of the rotary shaft 27. In FIG. 11C, symbol A represents a predetermined thickness of the CVD $SiO_2$ film formed on the wafers 24a to 24f and B represents a predetermined thickness of the PSG film.

First, the rotary shafts are rotated to make the heaters, exemplified by 28a and 28d, pivot away from the wafer holder 21 and the susceptors 22a to 22f are set in place. Then, the rotary shafts, exemplified by 29a and 29d, are rotated to make the heaters 28a to 28f approach the wafer holder 21. Then, the holders 26a to 26f are moved toward the side face 47b of the wafer mounting table 47 of the susceptors 22a to 22f to connect the exhaust pipe 52 with the suction port 48b and to engage the thermocouple 53 within the recess portion 48c, respectively.

Then, the first wafer 24a is transferred to the susceptor 22a located at the loading/unloading station 33a from a cassette by a robot (not-illustrated).

To adhere the first wafer 24a to the wafer mounting surface 23a of the susceptor 22a, air is evacuated through the exhaust port/gas introduction port 25a, and a solenoid valve (not illustrated) is opened to secure the first wafer 24a to the wafer mounting surface 23a by suction. Then, electric power is supplied to all the heaters to respectively heat susceptors 22a to 22f and keep the temperature of all wafer mounting surfaces 23a to 23f at approx. 350° C.

Then, after the temperature of the first wafer 24a reaches approx. 350° C., the rotary shaft 27 is rotated counterclockwise and the rotation is stopped when the susceptor 22a comes to a position just above the gas discharger 31a. In this case, because the moving time is as short as approx. 0.8 sec and the susceptor 22a has a large heat capacity, the temperature of the first wafer 24a hardly lowers during the moving period.

Then, a mixture gas of $TEOS-O_3$ is discharged from the gas discharger 31a as a reaction gas. In this case, the thickness of the $SiO_2$ film comes to approx. 2,000 Å, which is approx. ½ the thickness predetermined for the first wafer 24a. While the film is formed, the reaction gas is uniformly supplied onto the first wafer 24a because the susceptor 22a is given linear reciprocative motion in the radial direction by an oscillation unit (not shown). Thereby, the thickness of the formed $SiO_2$ film is made uniform and the film quality is improved.

During the above period, the second wafer 24b is mounted on the susceptor 22b located at the loading/unloading station 33a and the temperature of the second wafer 24b is kept at approx. 350° C., as described above.

Then, the rotary shaft 27 is rotated and the rotation is stopped when the susceptors 22b and 22a come to positions just above the gas dischargers 31a and 31b, respectively. In this case, it is possible to immediately start forming a film because the temperature of the second wafer 24b is already approx. 350° C. Therefore, the $TEOS-O_3$ mixture gas is immediately discharged from the gas dischargers 31a and 31b as a reaction gas. When this state is kept for approx. 1 min, an $SiO_2$ film with a thickness of approx. 4,000 Å, which is the predetermined thickness, is formed on the first wafer 24a and an $SiO_2$ film with a thickness of approx. 2,000 Å, which is approx. ½ the predetermined thickness, is formed on the second wafer 24b.

During the above period, the third wafer 24c is mounted on the susceptor 22a located at the loading/unloading station 33a and the temperature of the third wafer 24c is raised to approx. 350° C., as described above.

Then, the rotary shaft 27 is rotated and the rotation is stopped when the susceptors 22c, 22b, and 22a come to positions just above the gas dischargers 31a, 31b, and 31c, respectively. In this case, it is possible to immediately start forming a film because the temperature of the third wafer 24c is already approx. 350° C. Therefore, a mixture gas of $TEOS-O_3$ and TMPO is immediately discharged from the gas dischargers 31a, 31b, and 31c as a reaction gas. When this state is kept for approx. 1 min, a PSG film with a thickness of approx. 2,000 Å, which is approx. ½ the predetermined thickness, is formed on the first wafer 24a, $SiO_2$ film with a thickness of approx. 4,000 Å, which is the predetermined thickness, is formed on the second wafer 24b, and moreover, a $SiO_2$ film with a thickness of 2,000 Å which is approx. ½ the predetermined thickness, is formed on the third wafer 24c.

Thus, wafers are placed on the susceptors 22d to 22f for advancing one by one to form a two-layer insulating film made of a combination of a $SiO_2$ film and a PSG film on each wafer. When the first wafer 24a completes a round of the rotary shaft 27 and returns to the loading/unloading station 33a, the SiO₂ film and the PSG film of the predetermined thickness have been formed on the first wafer 24a. During the above period, the wafer temperature for film forming remains very stable.

When a robot is moved to the loading/unloading station 33a, the solenoid valve for operating the vacuum chuck of the susceptor 22a is closed, and a nitrogen-introduction valve (not shown) is opened to supply nitrogen gas to the vacuum chuck, the first wafer 24a is held by the robot and detached from the wafer mounting surface 23a. Then, the first wafer 24a is transferred to a cooling chamber at the cassette station by the robot. The first wafer 24a transferred to the cooling chamber is air-cooled by blowing nitrogen gas over it and then housed in a wafer cassette. Thus, a SiO₂ film and a PSG film, each of a predetermined thickness, are successively formed on wafers and the wafers are accumulated in the wafer cassette.

As described above, the method for forming a SiO₂ film using the CVD apparatus of the first embodiment makes it possible to keep a high throughput because the loading/unloading time is not added to the film forming period, because the loading/unloading operations are performed while simultaneously forming a film.

Moreover, by separating the susceptors 22a to 22f and the dischargers 31a to 31e from each other, it is possible to accurately control the production of each wafer.

Furthermore, because each of the susceptors 22a to 22f performs a linear reciprocative motion in the radial direction, a reaction gas is uniformly supplied to wafers.

Though the heaters are separated from the wafer holder 21 and moving wafers are moved away from the heaters, the wafer temperature hardly fluctuates because the wafer mounting table 47 has a large heat capacity and completes movement in a short time. It is thereby possible to form a film with a uniform thickness and a high quality on wafers.

For the above method for manufacturing the semiconductor device, a two-layer insulating film is formed by using two types of reaction gases. However, as shown in FIG. 11A, it is also possible to form a single film on the wafer 24l, while the wafer 24l completes a round, by supplying one type of gas to the gas dischargers 31a to 31e.

Moreover, it is possible to form a single film by a method similar to the batch system by setting wafers 24g to 24k on all the susceptors 22a to 22f and thereafter forming a film on the wafers 24g to 24k at the same time by using one type of reaction gas.

We claim:

1. An apparatus for forming a film on a plurality of wafer substrates, comprising:

a wafer holder providing, on one side thereof, a plurality of wafer holding surfaces, each wafer holding surface holding a single wafer substrate, said wafer holder comprising a holder frame and a plurality of separate susceptors detachably supported by said frame, each of said susceptors providing one of said wafer holding surfaces and an integral back surface coextensive with said one wafer holding surface, each of said wafer holding surfaces having vacuum port means whereby said susceptors serve as vacuum chucks to hold wafer substrates;

vacuum means for establishing a vacuum and for communicating the vacuum to said vacuum port means;

rotary shaft means, supporting said wafer holder, for rotating said wafer holding surfaces within a single plane;

a plurality of gas dischargers, arranged in a circle around said rotary shaft means, each of said gas dischargers positioned to face and direct a reaction gas onto a single wafer substrate; and a plurality of heaters facing said back surfaces of said susceptors, each of at least several of said heaters being paired and vertically aligned with one of said gas dischargers for heating a single wafer substrate indirectly, through a back surfaces of one of said susceptors, said plurality of heaters being spaced from said wafer holder and from said plurality of gas dischargers, with said wafer holder in between, said wafer holder being rotatable by said shaft relative to said plurality of heaters and plurality of gas dischargers.

2. An apparatus in accordance with claim 1 wherein each of said susceptors is defined by one of said wafer holding surfaces, a rear surface and edge surfaces and comprises an internal duct providing fluid communication between a suction port formed at an edge surface of said susceptor and at least one port at the wafer holding surface of said susceptor, said duct providing for communication of a vacuum and gas pressure.

3. An apparatus in accordance with claim 1 wherein each of said susceptors is defined by one of said wafer holding surfaces, a rear surface and edge surfaces and wherein each of said susceptors has a recess formed in one of said edge surfaces for receiving temperature measuring means.

4. An apparatus in accordance with claim 2 further comprising an exhaust pipe detachably connected to said port in said edge surface.

5. An apparatus in accordance with claim 2 further comprising:

an exhaust pipe detachably connected to said port in said edge surface;

a recess formed in an edge surface of each of said susceptors;

temperature measuring means inserted into each of said recesses; and holding means, associated with each of said susceptors, for securing one exhaust pipe and one temperature measuring means to said wafer holder.

6. An apparatus in accordance with claim 5 wherein said holding means is mounted on a slide for reciprocating movement relative to said wafer holder surface between a first position wherein said exhaust pipe is connected to said port in said edge surface and said temperature measuring means is inserted into said recess and a second position wherein said exhaust pipe is disconnected from said port in said edge surface and said temperature measuring means is withdrawn from said recess.

7. An apparatus in accordance with claim 1 wherein each of said susceptors comprises a susceptor frame and a metallic wafer mounting table mounted in said susceptor frame and wherein at least a portion in the susceptor frame in contact with said wafer mounting table is fabricated of a heat-insulating material.

8. An apparatus in accordance with claim 1 wherein each of said heaters is pivotally mounted for pivotal motion about an axis parallel to said single plane.

* * * * *

UNITED STATES PATENT AND TRADEMARK OFFICE
CERTIFICATE OF CORRECTION

PATENT NO. : 5,679,165
DATED : October 21, 1997
INVENTOR(S) : MAEDA et al

It is certified that error appears in the above-indentified patent and that said Letters Patent is hereby corrected as shown below:

Col. 10, line 12, "surfaces" should read --surface--.

Signed and Sealed this

Twenty-second Day of September, 1998

Attest:

BRUCE LEHMAN

*Attesting Officer*  *Commissioner of Patents and Trademarks*